(12) United States Patent
Macours et al.

(10) Patent No.: US 11,768,541 B2
(45) Date of Patent: *Sep. 26, 2023

(54) AUDIO-HAPTIC SIGNAL GENERATOR

(71) Applicant: GOODIX TECHNOLOGY (HK) COMPANY LIMITED, Hong Kong (CN)

(72) Inventors: Christophe Marc Macours, Hodelge (BE); Temujin Gautama, Boutersem (BE)

(73) Assignee: GOODIX TECHNOLOGY (HK) COMPANY LIMITED, Hong Kong (HK)

( * ) Notice: Subject to any disclaimer, the term of this patent is extended or adjusted under 35 U.S.C. 154(b) by 0 days.

This patent is subject to a terminal disclaimer.

(21) Appl. No.: 17/707,233

(22) Filed: Mar. 29, 2022

(65) Prior Publication Data

US 2022/0221937 A1     Jul. 14, 2022

Related U.S. Application Data

(63) Continuation of application No. 16/726,887, filed on Dec. 25, 2019, now Pat. No. 11,320,907.

(30) Foreign Application Priority Data

Jan. 7, 2019 (EP) .................................... 19150625

(51) Int. Cl.
*G06F 3/01* (2006.01)
*G06F 3/16* (2006.01)
(Continued)

(52) U.S. Cl.
CPC ............... *G06F 3/016* (2013.01); *G06F 3/16* (2013.01); *H03F 1/30* (2013.01); *H04R 3/04* (2013.01);
(Continued)

(58) Field of Classification Search
CPC ... G06F 3/016; G06F 3/16; H03F 1/30; H03F 2200/03; H04R 3/04; H04R 9/022; H04R 9/06; H03G 3/3005
See application file for complete search history.

(56) References Cited

U.S. PATENT DOCUMENTS 11,320,907 B2 * 5/2022 Macours ................... G06F 3/16
2012/0013220 A1   1/2012 Kawata et al.
(Continued)

FOREIGN PATENT DOCUMENTS

CN          106878874 A       6/2017
CN          108076419 A       5/2018

OTHER PUBLICATIONS

Chang, A. et al., "Audio-Haptic Feedback in Mobile Phones", retreived from the internet https://www.researchgate.net/publication/221514366; Conference Paper, CJI 2005, Portland, OR, USA, Apr. 2-7, 2004; 5 pages (Jan. 2005).

*Primary Examiner* — Daryl C Pope
(74) *Attorney, Agent, or Firm* — Scully, Scott, Murphy & Presser, P.C

(57) ABSTRACT

An audio-haptic signal generator for a haptic system including an amplifier coupled to a haptic actuator is described. The audio-haptic signal generator includes an audio input configured to receive an audio signal; a haptic input configured to receive a haptic signal and a controller configured to receive to at least one of the haptic signal, an amplifier state and a haptic actuator state. A mixer is coupled to the audio input and the haptic input. The mixer has an output configured to be coupled to a haptic actuator. The controller controls the mixer to process the audio signal dependent on at least one of a characteristic of the haptic signal, an amplifier state, and a haptic actuator state. The mixer is configured to mix the haptic signal and processed audio (Continued)

signal on to output the mixed haptic signal and processed audio signal.

20 Claims, 5 Drawing Sheets

(51) Int. Cl.
  *H03F 1/30* (2006.01)
  *H04R 3/04* (2006.01)
  *H03G 3/30* (2006.01)
(52) U.S. Cl.
  CPC ....... *H03F 2200/03* (2013.01); *H03G 3/3005* (2013.01)

(56) References Cited

U.S. PATENT DOCUMENTS

| | | |
|---|---|---|
| 2012/0062491 A1 | 3/2012 | Coni et al. |
| 2016/0004311 A1 | 1/2016 | Yliaho |
| 2016/0063825 A1 | 3/2016 | Moussette et al. |
| 2016/0187987 A1 | 6/2016 | Ullrich et al. |
| 2017/0169674 A1 | 6/2017 | Macours |
| 2017/0280254 A1 | 9/2017 | Chen |
| 2018/0304310 A1 | 10/2018 | Long et al. |
| 2018/0321748 A1 | 11/2018 | Rao et al. |

\* cited by examiner

150

AUDIO-HAPTIC SIGNAL GENERATOR

CROSS-REFERENCE TO RELATED APPLICATIONS

This application is a continuation of U.S. patent application Ser. No. 16/726,887, filed on Dec. 25, 2019, which claims priority to European Patent Application No. 19150625.2, filed on Jan. 7, 2019 and entitled "AUDIO-HAPTIC SIGNAL GENERATOR". All of the aforementioned patent applications are hereby incorporated by reference in their entireties

TECHNICAL FIELD

This disclosure relates to an audio-haptic signal generator and a method of audio-haptic signal generation.

BACKGROUND

Human-Machine Interaction (HMI) relies increasingly on cross-modal user interaction, where multiple sensory modalities are involved. In particular, cross-modal auditive and tactile feedback may be used to enhance touch interfaces. A typical example is a "virtual button", where button presses are detected by means of a touch sensor, and user feedback is provided by means of a vibration or haptic feedback and, usually, sound. A proper design of the tactile and auditive feedback makes it possible to mimic a real physical button. The combination of tactile and auditive feedback may be referred to as audio-haptics. Such a virtual button is available on some commercial smart phones. Physical buttons suffer from reliability issues due to ingress for example of dust and water, deteriorate over time, and add a physical constraint to the design of a device. Virtual buttons, on the other hand, are more reliable and relatively easy to integrate, multi-functional, and reprogrammable.

SUMMARY

Various aspects of the disclosure are defined in the accompanying claims. In a first aspect there is provided an audio-haptic signal generator for a haptic system, the haptic system comprising an amplifier coupled to a haptic actuator, the audio-haptic signal generator comprising: an audio input configured to receive an audio signal; a haptic input configured to receive a haptic signal; a controller configured to receive at least one of the haptic input signal, an amplifier state and a haptic actuator state; a mixer coupled to the audio input and the haptic input and having a mixer output configured to be coupled to a haptic actuator; wherein the controller is configured to control the mixer to process the audio signal dependent on at least one of a characteristic of the haptic signal, an amplifier state, and a haptic actuator state; and wherein the mixer is configured to mix the haptic signal and the processed audio signal and to output the mixed audio-haptic signal.

In one or more embodiments, the controller may be further configured to control the mixer to process the audio signal dependent on a characteristic of the audio signal.

In one or more embodiments, the controller may further comprise an amplifier sensor input configured to be coupled to the amplifier, wherein the controller is further configured to determine an amplifier state from a sensor signal received on the amplifier sensor input and to control the mixer to process the audio signal dependent on the amplifier state.

The amplifier state may comprise at least one of the amplifier boost voltage, the amplifier voltage clipping level, the amplifier current clipping level, the amplifier load current, and the amplifier die temperature.

In one or more embodiments, the controller may further comprise a haptic actuator sensor input configured to be coupled to a haptic actuator, wherein the controller is further configured to determine a haptic actuator state from a haptic actuator sensor signal received on the haptic actuator sensor input and to control the mixer to process the audio signal dependent on the haptic actuator state.

The haptic actuator state may comprise at least one of a haptic actuator resonant frequency, a haptic actuator excursion, a haptic actuator velocity, a haptic actuator acceleration and a haptic actuator voice coil temperature estimate.

In one or more embodiments, the mixer may be configured to process the audio signal by at least one of time-shifting the audio signal with respect to the haptic signal, applying a gain to the audio signal, applying a frequency-dependent gain to the audio signal, applying a frequency-dependent phase-shift to the audio signal, and high pass filtering the audio signal.

In one or more embodiments, the mixer may comprise an audio processor coupled to an adder wherein the audio processor input is coupled to the audio input, the audio processor output is coupled to a first input of the adder and the haptic signal input is coupled to a second input of the adder.

In one or more embodiments, the audio processor may comprise at least one of a delay adjuster, a gain adjuster and a phase adjuster.

In one or more embodiments, the audio processor may comprise a series arrangement of at least two of a delay adjuster, a gain adjuster and a phase adjuster coupled between the audio processor input and the audio processor output.

In one or more embodiments, the controller may comprise: a state parameter calculator coupled to an amplifier sensor input and a haptic sensor input, and a having state parameter calculator output wherein the state parameter calculator is configured to determine an amplifier state from an amplifier sensor signal received on the amplifier sensor input and a haptic state from a haptic sensor signal received on the haptic sensor input;

an amplitude-frequency detector coupled to the audio input and the haptic input and having an amplitude-frequency detector output; at least one of a delay controller, a gain controller, and a phase controller; wherein the delay controller comprises a first delay controller input coupled to the state parameter calculator output, a second delay controller input coupled to the amplitude-frequency detector output, and a delay controller output coupled to the delay adjuster; the gain controller comprises a first gain controller input coupled to the state parameter calculator output, a second gain controller input coupled to the amplitude-frequency detector output, and a gain controller output coupled to the gain adjuster; and the phase controller comprises a first phase controller input coupled to the state parameter calculator output, a second phase controller input coupled to the amplitude-frequency detector output, and a phase controller output coupled to the phase adjuster.

Embodiments of the audio-haptic signal generator may be included in a haptic system include an amplifier having an input coupled to the output of the mixer and an output configured to be coupled to a haptic actuator.

Embodiments of the audio-haptic signal generator may be included in a human-machine interface, for example a touch panel or touch screen.

In a second aspect there is provided a method of generating an audio-haptic signal generation for a haptic system, the haptic system including an amplifier driving a haptic actuator, the method comprising: receiving an audio signal; receiving a haptic signal; processing the audio signal dependent on at least one of a characteristic of the haptic signal, and amplifier state, and a haptic actuator state; and mixing the processed audio signal and the haptic signal.

In one or more embodiments, the method may comprise processing the audio signal dependent on a characteristic of the audio signal.

In a third aspect there is provided audio-haptic signal generator comprising: an audio input configured to receive an audio signal; a haptic input configured to receive a haptic signal; a controller having a first controller input coupled to the haptic input; an audio processor coupled to the audio input and a controller output; an adder coupled to an output of the audio processor output and the haptic input and configured to combine the haptic signal and processed audio signal; wherein the controller is configured to control the audio processor to process the audio signal dependent on a characteristic of the haptic signal; and the audio-haptic signal generator is configured to output the combined haptic signal and processed audio signal.

In one or more embodiments, the controller may further comprise an amplifier sensor input configured to be coupled to the amplifier, and a state parameter calculator coupled to the amplifier sensor input wherein the controller is further configured to determine an amplifier state and the audio processor is configured to process the audio signal dependent on the amplifier state.

In one or more embodiments, the controller may further comprise a haptic actuator sensor input configured to be coupled to the haptic actuator, and a state parameter calculator coupled to the haptic actuator sensor input wherein the controller is further configured to determine an amplifier state and the audio processor is configured to process the audio signal dependent on the amplifier state.

In one or more embodiments, the controller may comprise a second controller input coupled to the audio input and wherein the controller may be further is configured to control the audio processor to process the audio signal dependent on a characteristic of the audio signal.

In one or more embodiments, the audio processor may comprise at least one of a delay adjuster, a gain adjuster and a phase adjuster.

BRIEF DESCRIPTION OF DRAWINGS

In the figures and description like reference numerals refer to like features. Embodiments of are now described in detail, by way of example only, illustrated by the accompanying drawings in which.

DESCRIPTION OF EMBODIMENTS

Figure 1:
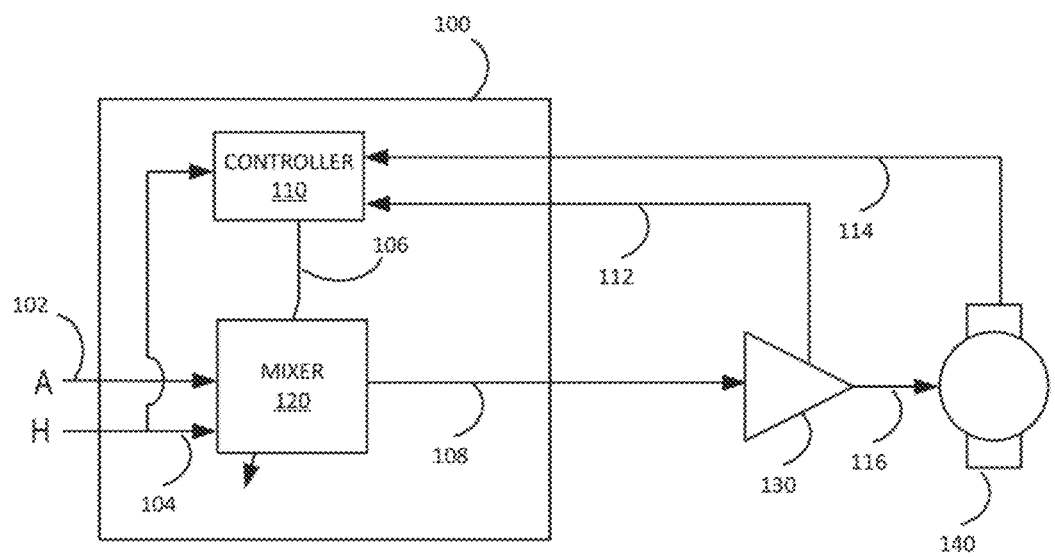
FIG. 1 shows an audio-haptic signal generator according to an embodiment.

FIG. 1 shows an audio-haptic signal generator 100 according to an embodiment. The audio-haptic signal generator 100 includes a controller 110 and a mixer 120. An audio signal input 102 may be connected to a first input of the mixer 120. A haptic signal input 104 may be connected to a second input of the mixer 120. The haptic signal input 104 may be connected to an input of the controller 110. The controller 110 may have an amplifier sensor input 112 and a haptic actuator sensor input 114. The controller 110 may have a control output 106 connected to a control input of the mixer 120.

In operation the mixer output 108 may be connected to an amplifier 130 which may be for example a class-D audio amplifier, class A amplifier or class AB amplifier. The amplifier output 116 may be connected to a haptic actuator 140 which may be for example an electrodynamic actuator such as a linear resonant actuator (LRA), or a piezo electric actuator. The amplifier sensor input 112 may be connected to the amplifier 130. The haptic actuator 140 may be connected to the haptic actuator sensor input 114.

For an audio-haptic effect, an audio signal may be received on the audio signal input 102 and a haptic signal may be received on the haptic signal input 104. An audio signal in this context may be considered as an auditive signal intended to primarily to generate a specific audible sound intended to be heard by a user when driving the haptic actuator. The audio signal may typically be designed to avoid generating vibrations that may interfere with the intended vibrations resulting from the haptic signal.

The haptic signal is a signal primarily intended to generate specific tactile or haptic feedback when used to drive a haptic actuator. There is no desired audible effect.

In operation the controller 110 may receive the audio signal, the haptic signal, an amplifier sensor signal and/or a haptic actuator sensor signal.

The amplifier sensor signal may for example directly indicate or be used to determine an amplifier state. The amplifier state may include one or more of an amplifier boost voltage, a voltage clipping level, a current clipping level, a current consumption value which for portable devices may indicate a battery current, and an amplifier integrated circuit die temperature.

The haptic actuator sensor signal may for example directly indicate or be used to determine a haptic actuator state. For a LRA, a haptic actuator state may include one or more of a resonant frequency, a LRA excursion, velocity or acceleration value or LRA voice coil temperature value. The haptic actuator sensor signal may for example be a signal representative of the current flowing into the haptic actuator.

The controller 110 may apply a control signal to the mixer 120 dependent on one or more of the haptic actuator state, the amplifier state, and a characteristic of the haptic signal in order that the resulting output of the mixer does not exceed the system limitations. The controller 110 controls the mixer 120 which may process the audio signal dependent on the control signal.

Example system limitations may include a limitation that the amplifier output voltage does not exceed an amplifier clip level, the current consumption does not exceed a battery current limit. Further limitation may include limiting LRA excursion so that it does not exceed predefined limits to prevent one or more of mechanical damage and audible mechanical artefacts and limiting LRA voice coil temperature to mitigate against thermal damage.

The characteristic of the audio signal or haptic signal may include for example one or more of the instantaneous signal value, the time-varying amplitude, the frequency spectrum or the peak value. The processing of the audio signal may include applying a delay to the audio signal with respect to the haptic signal. The processing of the audio signal may include applying a time-varying gain to the audio signal. The processing of the audio signal may include applying a frequency dependent amplitude change to the audio signal. The processing of the audio signal may include applying a frequency dependent phase change to the audio signal. The mixer 120 may process the signal to apply a high pass filter to the audio signal by applying a frequency dependent gain and phase shift. The mixer 120 may combine the adapted or processed audio signal with the haptic signal and output the mixed adapted audio and haptic signal on the mixer output 108. The amplifier 130 which may also be referred to as a haptic driver may amplify the mixed adapted audio and haptic signal and drive the haptic actuator 140 with the combined signal.

It will be appreciated that in some examples, the controller 110 may control the mixer 120 to process the audio signal determined from only a characteristic of the haptic signal. In these examples, the amplifier sensor input 112 and the haptic actuator sensor input 114 may be omitted. In other examples the controller 110 may adapt the audio signal determined only from one of an amplifier state or a haptic actuator state. In these examples, the connection from the haptic signal input 104 to the controller 110 and one of the amplifier sensor input 112 and the haptic actuator sensor input 114 may be omitted.

The audio-haptic signal generator 100 may be implemented in hardware or a combination of hardware and software, for example by software executable on a microcontroller or digital signal processor. In some examples the amplifier 130 and the audio-haptic signal generator 100 may be included on the same device.

The inventors of the present disclosure have appreciated that a haptic actuator such as a LRA which is traditionally intended only to produce haptic effects may be controlled by the audio-haptic signal generator 100 to simultaneously output a combined audio and haptic signal for example for an audio haptic effect without overdriving the LRA while not degrading the haptic performance. This may avoid the requirement for an additional loudspeaker or using an expensive multi-function transducer. The inventors of the present disclosure have further appreciated that by adapting or processing the audio signal, the haptic performance of a haptic actuator such as a LRA may be unaffected by the additional audio signal. The inventors of the present disclosure have further appreciated that the user experiences may be more robust to signal modifications on the auditive signal component of the audio-haptic feedback signal than the haptic signal component.

Figure 2:
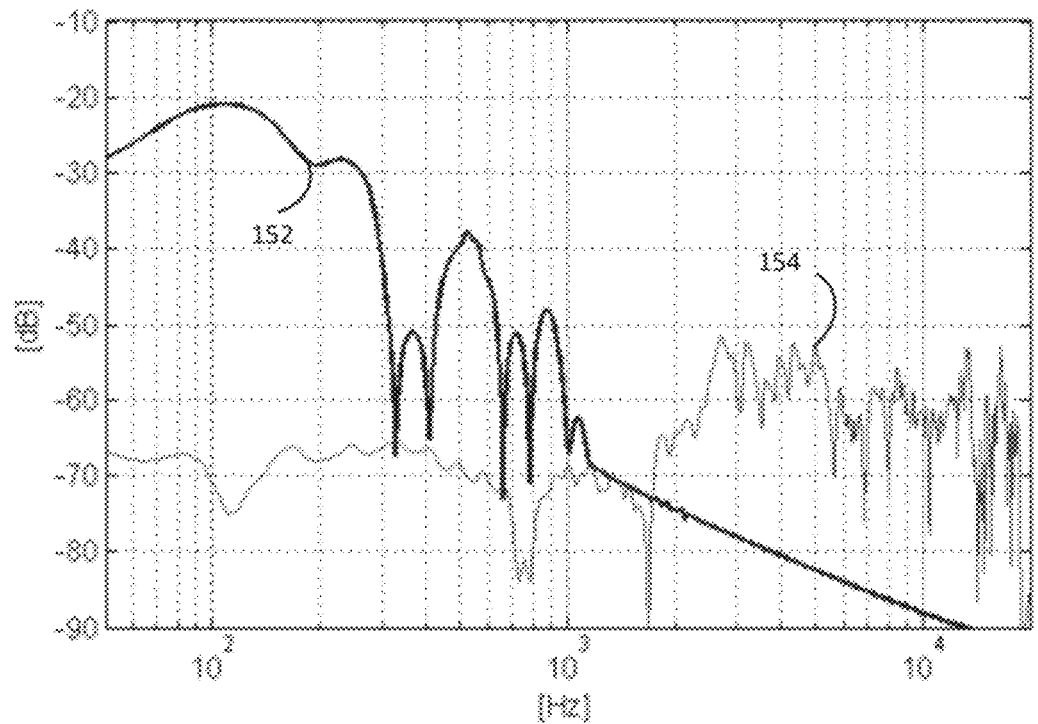
FIG. 2 illustrates the frequency response of an audio signal and a haptic signal which provide an example virtual button effect.

An example operation of the audio-haptic signal generator 100 for a virtual click audio-haptic signal may be further understood with reference to FIGS. 2, 3A, 3B and 3C. FIG. 2 shows an example frequency spectrum 150 of haptic signal 152 and an audio signal 154 for a typical virtual button effect. The x-axis indicates frequency on a logarithmic scale from 50 Hz to 20 kHz. The y axis indicates the amplitude in dB. The haptic signal 152 is concentrated at low frequencies below 1 kHz and particularly below 300 Hz. The audio signal 154 is concentrated at higher frequencies typically above 2 kHz.

Figure 3A:
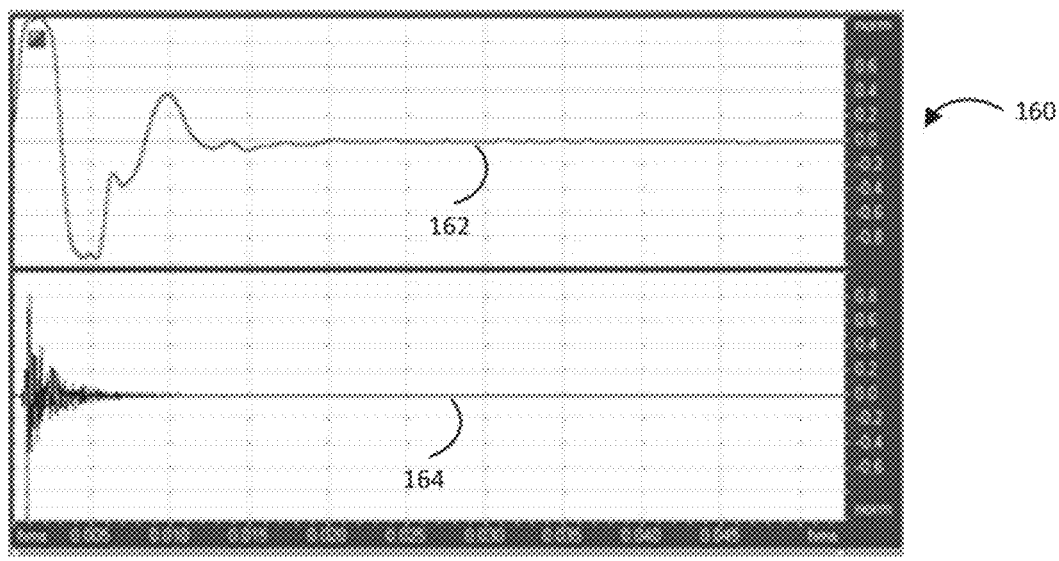
FIG. 3A shows a graph illustrating the example haptic signal and audio signal of FIG. 2 which in combination provide a virtual button effect.

FIG. 3A shows a plot of the audio and haptic virtual click signals 160. The haptic signal is shown by line 162. The audio signal is shown by line 164. The y-axis shows the normalized amplitude between −1 and +1 In this example, amplifier voltage clipping occurs for sample values beyond this range. The x-axis shows time varying between 0 and 50 milliseconds.

Figure 3B:
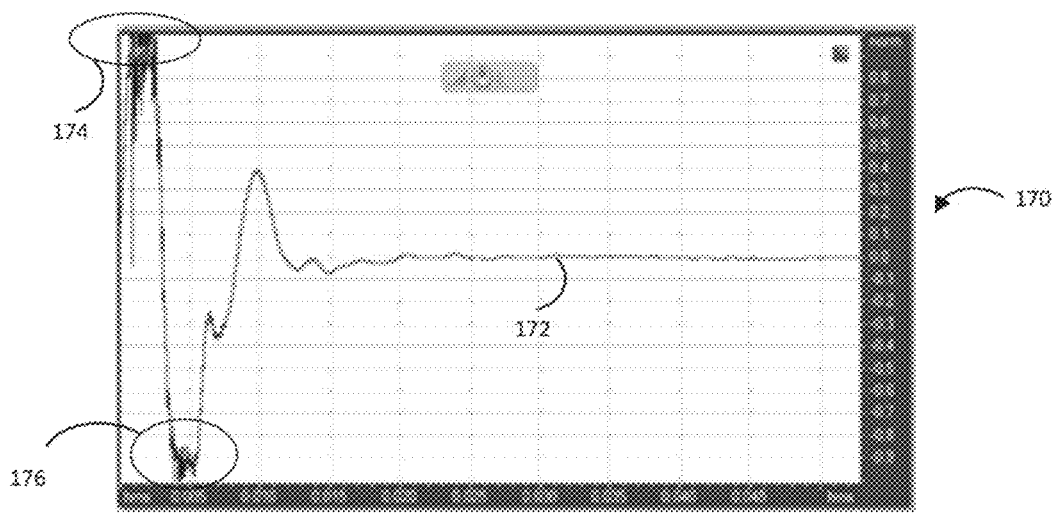
FIG. 3B illustrates a combined haptic actuator signal and the audio signal.

FIG. 3B shows illustrates the audio-haptic signal 170. Line 172 shows the combined audio signal 162 and haptic signal 164 resulting from simple mixing. This results in amplifier clipping as indicated in regions 174 and 176.

Figure 3C:
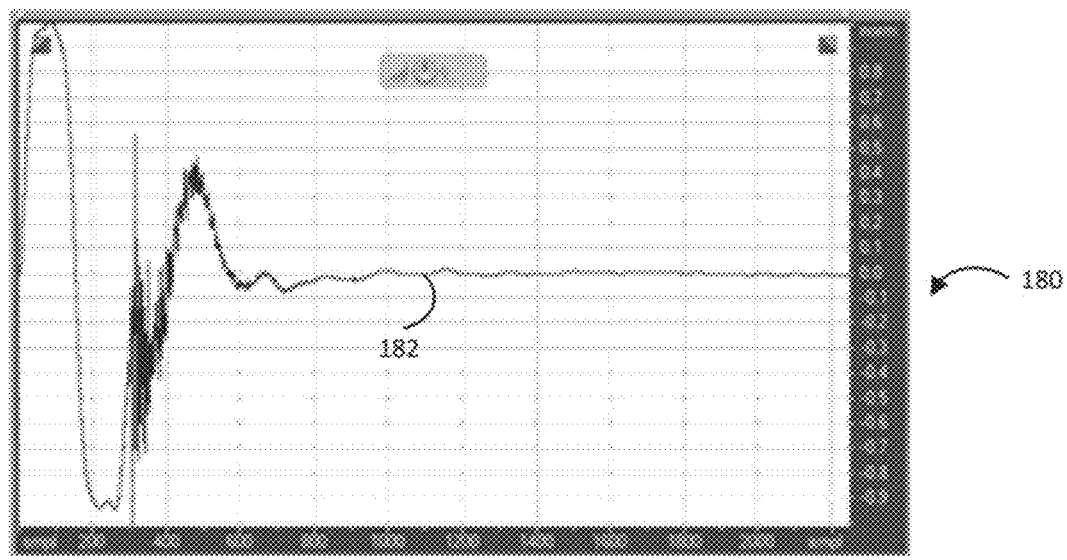
FIG. 3C illustrates an example combined haptic actuator signal and delayed audio signal.

FIG. 3C shows the audio-haptic signal 180. Line 182 shows the combined audio signal 162 and haptic signal 164 resulting from mixing by the audio-haptic signal generator 100. The audio-haptic signal generator 100 may determine from the detected amplitude of the haptic signal that amplifier clipping is likely to occur if the audio signal is mixed at the same time and so delays the audio signal, in this example by 6 milliseconds before mixing. The result is that amplifier clipping is avoided and as the delay is relatively small, there may be no perceptible difference to a user.

Figure 4:
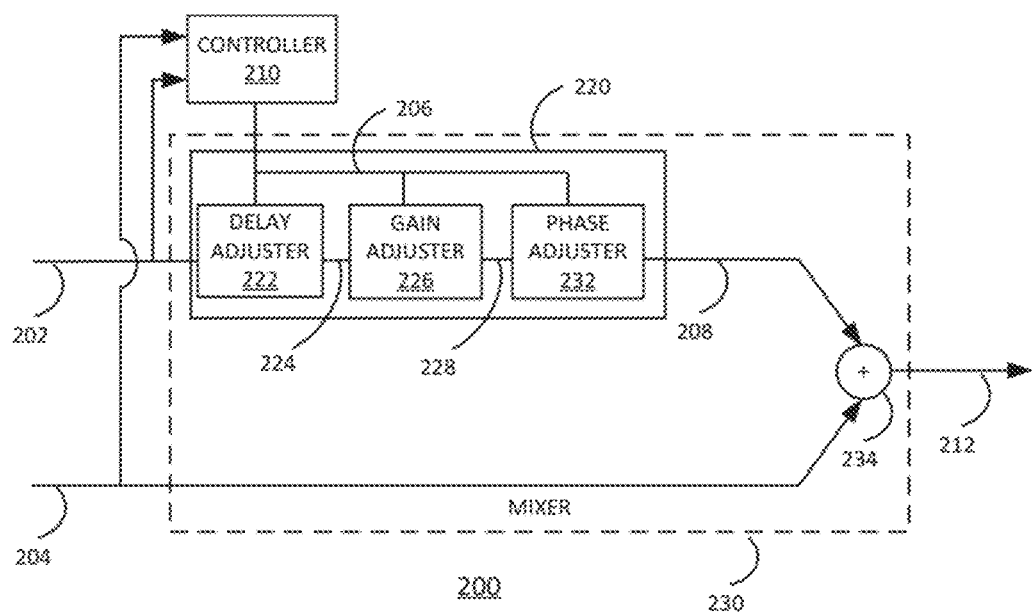
FIG. 4 illustrates an audio-haptic signal generator according to an embodiment.

FIG. 4 shows an audio-haptic signal generator 200 according to an embodiment. The audio-haptic signal generator 200 includes a controller 210 and a mixer 230. The mixer 230 includes an audio processor 220 and an adder 234. The audio processor 220 may include a delay adjuster 222 having an input connected to an audio signal input 202. The delay adjuster 222 may have an output 224 connected to a gain adjuster 226. The gain adjuster 226 may have an output 228 connected to a phase adjuster 232. The phase adjuster 232 may have an output 208 connected to a first input of the adder 234. The second input of the adder 234 may be connected to a haptic signal input 204. The controller 210 may have an output 206 connected to the delay adjuster 222, the gain adjuster 226 and the phase adjuster 232. The controller 210 may have a first input connected to the audio signal input 202. The controller 210 may have a second input connected to the haptic signal input 204. The output of the adder 234 may be connected to the mixer output 212. The mixer output 212 may be connected to an amplifier (not shown) which may drive a haptic actuator (not shown) such as a linear resonant actuator.

The controller 210 controls the audio processor 220 to adapt the audio signal dependent on at least one of a characteristic of the haptic signal and a characteristic of the audio signal. The characteristic of the haptic and audio signals may include for example one or more of the instantaneous signal value, the time-varying amplitude, the frequency spectrum or the peak value.

The audio processor 220 may process the audio signal by applying a delay to the audio signal with respect to the haptic signal with delay adjuster 222. The delay adjuster 222 may be implemented as a delay line element in hardware or software in combination with hardware. In some examples the delay adjuster may delay the audio signal until the haptic signal amplitude is below a predetermined threshold.

The audio processor 220 may process the audio signal by applying a time-varying gain to the audio signal or applying a frequency dependent amplitude change to the audio signal with gain adjuster 226. In some examples, the gain adjuster 226 may apply a smoothed sample-based gain control typically implemented in dynamic range controllers or limiters. Alternatively, or in addition, in some examples the gain adjuster 226 may include a first stage of a variable gain or filter-bank with variable gains per sub-band implemented using an analysis filter-bank or fast fourier transform (FFT) followed by a second stage including variable gain stage and in third stage including a synthesis filter-bank or an inverse fast fourier transform (iFFT) or similar technique.

The audio processor 220 may process the audio signal by applying a frequency dependent phase change to the audio signal with phase adjuster 232. In some examples, the phase adjuster 232 may include all-pass filters to adapt the audio signal so that the audio signal is out of phase with respect to the haptic signal when the effect of the haptic signal alone is close to one of the system limits.

The adder 234 may combine the processed audio signal output from the audio processor 220 with the haptic signal and output the mixed processed audio and haptic signal on the mixer output 212. The amplifier (not shown) which may also be referred to as a haptic driver may amplify the mixed adapted audio and haptic signal and drive the haptic actuator (not shown) with the combined signal.

The audio-haptic signal generator 200 may be implemented in hardware or a combination of hardware and software for example software executable on a microcontroller or digital signal processor.

The audio-haptic signal generator 200 may allow simultaneous output of a combined audio and haptic signal for example to produce an audio-haptic effect without overdriving a haptic actuator such as a LRA typically designed for haptic output only, while maintaining the haptic performance. Furthermore, by adapting the audio signal, the haptic performance of a haptic actuator such as a LRA may be unaffected by the additional audio signal. The audio-haptic signal generator 200 may process the audio signal dependent on both the audio signal characteristic and the haptic signal characteristic. This may allow the controller 210 to more accurately adjust the delay, gain and phase of the audio signal than by using the haptic signal only.

Figure 5:
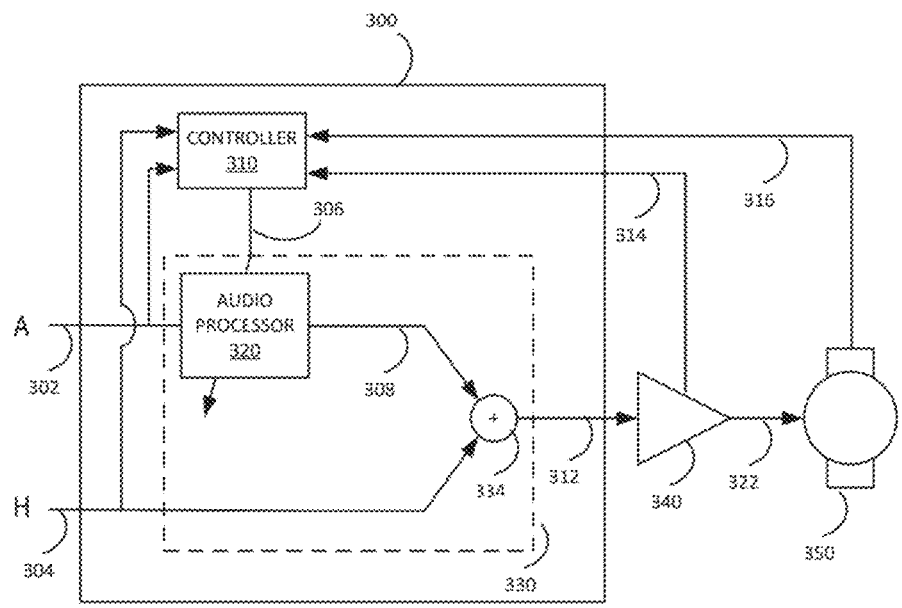
FIG. 5 shows another audio-haptic signal generator according to an embodiment.

FIG. 5 shows an audio-haptic signal generator 300 according to an embodiment. The audio-haptic signal generator 300 includes a controller 310 and a mixer 330. The mixer 330 includes an audio processor 320 and an adder 334. An audio signal input 302 may be connected to an input of the audio processor 320. An output 308 of the audio processor 320 may be connected to a first input of the adder 334. A haptic signal input 304 may be connected to a second input of the adder 334. The output of the adder 334 may be connected to mixer output 312. The haptic signal input 304 may be connected to a first input of the controller 310. The audio signal input 302 may be connected to a second input of the controller 310. The controller 310 may have an amplifier sensor input 314 and a haptic actuator sensor input 316. The controller 310 may have a control signal output 306 connected to a control input of the audio processor 320.

In operation the mixer output 312 may be connected to an amplifier 340 which may be for example a class-D audio amplifier. The amplifier output 322 may be connected to a haptic actuator 350 which may be for example a linear resonant actuator (LRA). The amplifier sensor input 314 may be connected to the amplifier 340. The haptic actuator 350 may be connected to the haptic actuator sensor input 316.

For an audio-haptic effect, an audio signal may be received on the audio signal input 302 and a haptic signal may be received on the haptic signal input 304. The audio signal is an auditive signal intended primarily to generate an audible output from the haptic actuator. The haptic signal is primarily intended to generate tactile or haptic feedback from the haptic actuator.

In operation the controller 310 may receive the haptic signal, the audio signal an amplifier sensor signal and a haptic actuator sensor signal.

The amplifier sensor signal may for example directly indicate or be used to determine an amplifier state. The haptic actuator sensor signal may for example directly indicate or be used to determine a haptic actuator state.

The controller 310 may apply a control signal to the audio processor 320 dependent on the haptic actuator state, the amplifier state, and a characteristic of the haptic signal and of the audio signal in order that the resulting output of the mixer 330 does not exceed the system limitations.

The processing of the audio signal by audio processor 320 may include applying a delay to the audio signal with respect to the haptic signal. The processing of the audio signal by audio processor 320 may include applying a time-varying gain to the audio signal. The processing of the audio signal by audio processor 320 may include applying a frequency dependent amplitude change to the audio signal. The processing of the audio signal by audio processor 320 may include applying a frequency dependent phase change to the audio signal. The adder 334 may combine the processed audio signal with the haptic signal and output the mixed processed audio and haptic signal on the mixer output 312. The amplifier 340 which may also be referred to as a haptic driver may amplify the mixed adapted audio and haptic signal and drive the haptic actuator 350 with the combined signal.

The audio-haptic signal generator 300 may allow mixing audio haptic signals without overdriving the system or degrading haptic performance. The audio-haptic signal generator 300 may allow a haptic actuator such as a LRA originally designed for haptic output only to be used with audio-haptic signals. Furthermore, since the controller 310 controls the audio processor 320 based on a characteristic of the audio signal and of the haptic signal, the amplifier state and the haptic actuator state, the control of the audio signal may be more accurate in staying within the system limitations of the amplifier and of the haptic actuator.

Figure 6:
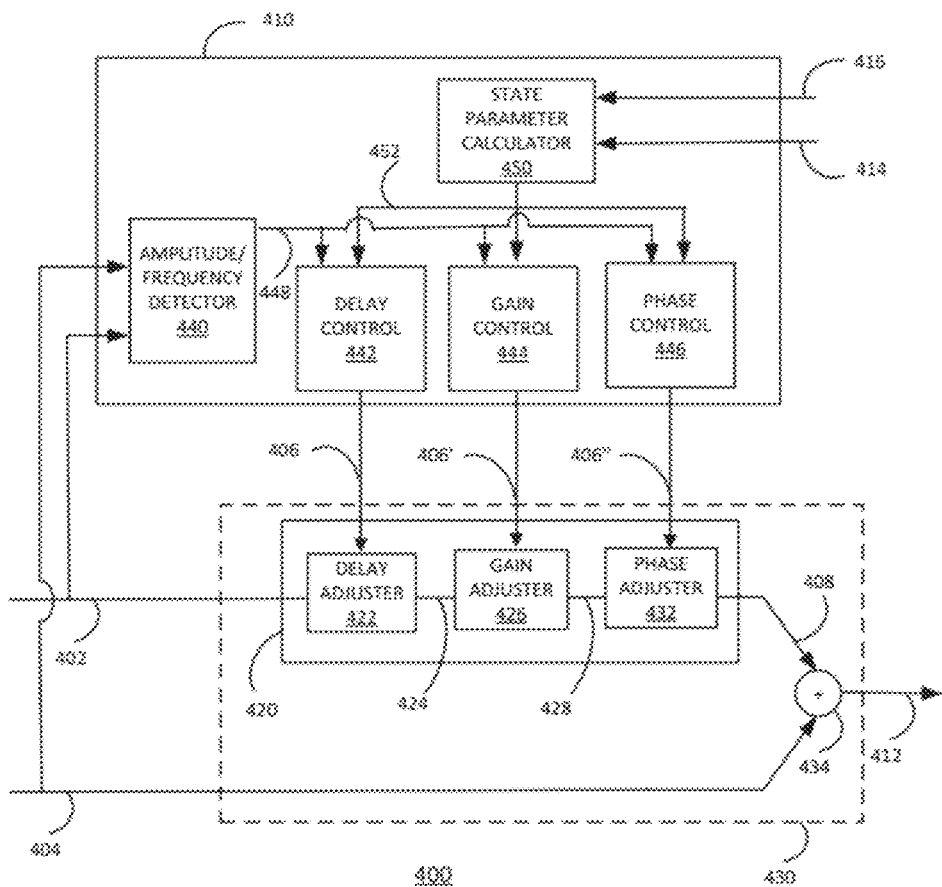
FIG. 6 illustrates an audio-haptic signal generator to according to an embodiment.

FIG. 6 shows an audio-haptic signal generator 400 according to an embodiment. The audio-haptic signal generator 400 includes a controller 410 and a mixer 430. The mixer 430 includes an audio processor 420 and an adder 434.

The audio processor 420 may include a delay adjuster 422 having an input connected to an audio signal input 402. The delay adjuster 422 may have an output 424 connected to a gain adjuster 426. The gain adjuster 426 may have an output 428 connected to a phase adjuster 432. The phase adjuster 432 may have an output connected to the audio processor output 408. The audio processor output 408 may be connected to a first input of the mixing module 434. The second input of the adder 434 may be connected to a haptic signal input 404.

The controller 410 may have an amplitude and frequency detector 440 connected to the audio signal input 402 and the haptic signal input 404. The amplitude and frequency detector output 448 may be connected to a delay controller 442. The output of the delay controller 442 may be connected to a delay control output 406. The amplitude and frequency detector output 448 may be connected to a gain controller 444. The output of the gain controller 444 may be connected to a gain control output 406'. The amplitude and frequency detector output 448 may be connected to a phase controller 446. The output of the phase controller 446 may be connected to a phase control output 406".

The delay control output 406 may be connected to the delay adjuster 422. The gain control output 406' may be connected to the gain adjuster 426. The phase control output 406" may be connected to the phase adjuster 432.

The controller 410 may have an amplifier sensor input 414 and a haptic actuator sensor input 416 connected to a state parameter calculator 450. The state parameter calculator 450 may have an output 456 connected to the delay controller 442, the gain controller 444 and the phase controller 446.

In operation the mixer output 412 may be connected to an amplifier (not shown) which is connected to a haptic actuator such as a linear resonant actuator. For an audio-haptic effect, an audio signal may be received on the audio signal input 402 and a haptic signal may be received on the haptic signal input 404. The amplitude and frequency detector 440 may determine characteristics of the audio signal and the haptic signal. These characteristics may include the instantaneous signal value, the time varying amplitude, peak amplitude and frequency spectrum. The amplitude and frequency detector 440 may output the characteristics of the audio signal and the haptic signal to the delay controller 442, the gain controller 444 and the phase controller 446.

The state parameter calculator 450 may receive an amplifier sensor signal from the amplifier (not shown) on the amplifier sensor input 414. The state parameter calculator 450 may receive a haptic sensor signal from the haptic actuator (not shown) on the haptic actuator sensor input 416.

The state parameter calculator 450 may determine an amplifier state value and a haptic actuator state value from the respective amplifier sensor value and the haptic actuator sensor value. In some examples, the state parameter calculator 450 may determine an estimate of excursion for a LRA and voice coil temperature from a haptic actuator current value. In other examples, the state parameter calculator 450 may determine an estimate of excursion for a LRA and voice coil temperature from an amplifier current value together with a model of the amplifier behaviour. The state parameter calculator 450 may provide haptic state and amplifier state values to the delay controller 442, the gain controller 444 and the phase controller 446.

The delay controller 442 may generate a delay control output value on the delay control output 406 determined from the audio and haptic signal characteristics provided by the amplitude and frequency detector 440, and the haptic actuator and amplifier states provided by the state parameter calculator 450. For example, when the sum of the instantaneous signal values of the audio and of the haptic signals exceeds the amplifier voltage clipping level, the delay controller 442 may control the delay adjuster 422 to apply a delay to the audio signal such that the peak value of the audio signal may be shifted in time.

The gain controller 444 may generate a gain control output value on the gain control output 406' determined from the audio signal characteristics, the haptic signal characteristics, the haptic actuator state, and the amplifier state. The gain adjuster 426 may adjust the gain of the audio signal dependent on the gain control output value.

For example, when the sum of the instantaneous signal values of the audio and of the haptic signals exceeds the amplifier voltage clipping level, the gain controller 444 may control the gain adjuster 426 to apply an attenuation corresponding to a gain value lower than 0 dB.

The phase controller 446 may generate a phase control output value on the phase control output 406" determined from the audio signal characteristics, the haptic signal characteristics, the haptic actuator state, and the amplifier state. The phase adjuster 432 may adjust the phase of the audio signal dependent on the gain control output value.

For example, when the sum of the instantaneous signal values of the audio and of the haptic signals exceeds the amplifier voltage clipping level, the phase controller 446 may control the phase adjuster 432 to apply an all-pass filter to the audio signal such that the peak value of the audio signal may be shifted in time.

The adder 434 may combine the processed audio signal output from the audio processor 420 with the haptic signal and output the mixed processed audio and haptic signal on the mixer output 412. The amplifier (not shown) which may also be referred to as a haptic driver may amplify the mixed adapted audio and haptic signal and drive the haptic actuator (not shown) with the combined signal.

The audio-haptic signal generator 400 may be implemented in hardware or a combination of hardware and software for example software executable on a microcontroller or digital signal processor.

The audio-haptic signal generator 400 may allow simultaneous output of a combined audio and haptic signal for example to produce an audio-haptic effect without overdriving a haptic actuator such as a LRA typically designed for haptic output only, while maintaining the haptic performance. Furthermore, by adapting the audio signal, the haptic performance of a haptic actuator such as a LRA may be unaffected by the additional audio signal. The audio-haptic signal generator 400 may process the audio signal dependent on both the audio signal characteristic, the haptic signal characteristic, the amplifier state and the haptic actuator state. This may allow the controller 410 to more accurately adjust the delay, gain and phase of the audio signal than by using the haptic signal, the amplifier state, or the haptic actuator state only.

In some examples any one or two of the delay adjuster 422, the gain adjuster 426 and the phase adjuster 432 may be omitted together with the corresponding the delay controller 442, gain controller 444 and phase controller 446. In some examples the delay adjuster 422, the gain adjuster 426 and the phase adjuster 432 may be arranged in a different order between the audio input 402 and the audio processor output 408.

Figure 7:
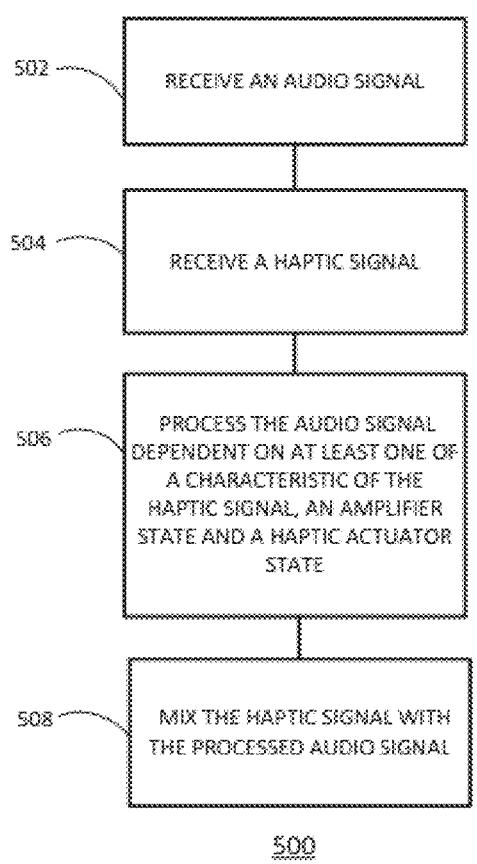
FIG. 7 illustrates a method of controlling a haptic actuator according to an embodiment.

FIG. 7 shows a method of generating an audio haptic signal 500 for a haptic system including an amplifier and a haptic actuator according to an embodiment. In step 502 an audio signal is received. In step 504, a haptic signal is received. In step 506 the audio signal is processed dependent on at least one of a characteristic of an audio signal, a characteristic of a haptic signal, an amplifier state and a haptic actuator state. In step 508 the processed audio signal is mixed with the haptic signal. The method 500 may allow audio and haptic signals to be combined and used by an amplifier to drive a haptic actuator intended to be used only for haptic signals without overdriving the system or degrading the haptic performance. This may avoid the requirement of a separate loudspeaker for auditive haptic effects. In some examples, the method 500 may be applied in real-time. In some examples, the method 500 may be applied to generate the audio-haptic signal for later use.

An audio-haptic signal generator for a haptic system including an amplifier coupled to a haptic actuator is described. The audio-haptic signal generator includes an audio input configured to receive an audio signal; a haptic input configured to receive a haptic signal and a controller configured to receive at least one of the haptic input signal, an amplifier state and a haptic actuator state. A mixer is coupled to the audio input and the haptic input. The mixer has an output configured to be coupled to a haptic actuator. The controller controls the mixer to process the audio signal dependent on at least one of a characteristic of the haptic signal, an amplifier state, and a haptic actuator state. The mixer is configured to mix the haptic signal and processed audio signal and to output the mixed haptic signal and processed audio signal.

Embodiments of the linear resonant actuator controller and method of controlling a linear resonant actuator may be included in mobile devices such as smart phones, smart watches portable medical devices, wearable devices, laptop computers, tablets. Embodiments may be included in any device using HMI with haptic and audio feedback. For example, the device may be a control panel for an industrial control, automotive control or domestic control system.

The audio-haptic signal generators described herein may for example be implemented in a touch panel using a single haptic actuator for many application domains, such as automotive and Internet of things (IoT) where physical buttons may be replaced by virtual buttons.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

What is claimed is:

1. An audio-haptic signal generator for a haptic system, the haptic system comprising an amplifier coupled to a haptic actuator, the audio-haptic signal generator comprising:
    an audio input configured to receive an audio signal;
    a haptic input configured to receive a haptic signal;
    a controller configured to receive at least one of the haptic input signal, an amplifier state and a haptic actuator state;
    a mixer coupled to the audio input and the haptic input and having a mixer output configured to be coupled to the amplifier; wherein
    the controller is further configured to control the mixer to process the audio signal dependent on at least one of a characteristic of the haptic signal, the amplifier state, and the haptic actuator state; and
    wherein the mixer is configured to mix the haptic signal and the processed audio signal and to output a mixed audio-haptic signal;
    wherein the mixer comprises an audio processor coupled to an adder and wherein the audio processor input is coupled to the audio input, the audio processor output is coupled to a first input of the adder and the haptic signal input is coupled to a second input of the adder.

2. The audio-haptic signal generator of claim 1 wherein the controller is further configured to control the mixer to process the audio signal dependent on a characteristic of the audio signal.

3. The audio-haptic signal generator of claim 1 wherein the controller further comprises an amplifier sensor input configured to be coupled to the amplifier, wherein the controller is further configured to determine the amplifier state from a sensor signal received on the amplifier sensor input and to control the mixer to process the audio signal dependent on the amplifier state; and
    the amplifier state comprises at least one of an amplifier boost voltage, an amplifier voltage clipping level, an amplifier current clipping level, an amplifier load current, and an amplifier die temperature.

4. The audio-haptic signal generator of claim 1 wherein the controller further comprises a haptic actuator sensor input configured to be coupled to a haptic actuator, wherein the controller is further configured to determine the haptic actuator state from a haptic actuator sensor signal received on the haptic actuator sensor input and to control the mixer to process the audio signal dependent on the haptic actuator state.

5. The audio-haptic signal generator of claim 4 wherein the haptic actuator state comprises at least one of a haptic actuator resonant frequency, a haptic actuator excursion, a haptic actuator velocity, a haptic actuator acceleration and a haptic actuator voice coil temperature.

6. The audio-haptic signal generator of claim 1 wherein the mixer is configured to process the audio signal by at least one of time-shifting the audio signal with respect to the haptic signal, applying a gain to the audio signal, applying a frequency-dependent gain to the audio signal, applying a frequency-dependent phase-shift to the audio signal, and high pass filtering the audio signal.

7. The audio-haptic signal generator of claim 1 wherein the audio processor comprises at least one of a delay adjuster, a gain adjuster and a phase adjuster.

8. The audio-haptic signal generator of claim 7 wherein the phase adjuster comprises an all-pass filters to adapt the audio signal so that the audio signal is out of phase with respect to the haptic signal when effect of the haptic signal alone is close to one of system limits.

9. The audio-haptic signal generator of claim 7 wherein the delay adjuster delays the audio signal until a haptic signal amplitude is below a predetermined threshold.

10. The audio-haptic signal generator of claim 7 wherein the audio processor comprises a series arrangement of at least two of the delay adjuster, the gain adjuster and the phase adjuster coupled between the audio processor input and the audio processor output.

11. The audio-haptic signal generator of claim 10 wherein the audio processor comprises the delay adjuster, the gain adjuster and the phase adjuster coupled between the audio processor input and the audio processor output;
  wherein the delay adjuster comprises a delay adjuster input and a delay adjuster output, the gain adjuster comprises a gain adjuster input and a gain adjuster output, the phase adjuster comprises a phase adjuster input and a phase adjuster output, the delay adjuster input is connected to the audio input, the delay adjuster output is connected to the gain adjuster input, the gain adjuster output is connected to the phase adjuster input, the phase adjuster output is connected to the first input of the adder.

12. The audio-haptic signal generator of claim 7 wherein the controller comprises:
  a state parameter calculator coupled to an amplifier sensor input and a haptic sensor input, and a having state parameter calculator output, wherein the state parameter calculator is configured to determine the amplifier state from an amplifier sensor signal received on the amplifier sensor input and a haptic state from a haptic sensor signal received on the haptic sensor input.

13. The audio-haptic signal generator of claim 12 wherein the controller further comprises:
  an amplitude-frequency detector coupled to the audio input and the haptic input and having an amplitude-frequency detector output;
  at least one of a delay controller, a gain controller, and a phase controller; and wherein
  the delay controller comprises a first delay controller input coupled to the state parameter calculator output, a second delay controller input coupled to the amplitude-frequency detector output, and a delay controller output coupled to the delay adjuster;
  the gain controller comprises a first gain controller input coupled to the state parameter calculator output, a second gain controller input coupled to the amplitude-frequency detector output, and a gain controller output coupled to the gain adjuster; and
  the phase controller comprises a first phase controller input coupled to the state parameter calculator output, a second phase controller input coupled to the amplitude-frequency detector output, and a phase controller output coupled to the phase adjuster.

14. The audio-haptic signal generator of claim 13 wherein the phase controller generates a phase control output value on a phase control output determined from an audio signal characteristics, a haptic signal characteristics, the haptic actuator state and the amplifier state, and the phase adjuster adjusts a phase of the audio signal dependent on the phase control output value.

15. The audio-haptic signal generator of claim 13 wherein the gain controller generates a gain control output value on a gain control output determined from an audio signal characteristics, a haptic signal characteristics, the haptic actuator state and the amplifier state, and the gain adjuster adjusts a gain of the audio signal dependent on the gain control output value.

16. The audio-haptic signal generator of claim 13 wherein the delay controller generates a delay control output value on a delay control output determined from an audio signal characteristics and a haptic signal characteristics provided by the amplitude-frequency detector, and the haptic actuator state and the amplifier state provided by the state parameter calculator.

17. The audio-haptic signal generator of claim 16 wherein when a sum of an instantaneous signal values of the audio and of the haptic signals exceeds an amplifier voltage clipping level, the delay controller controls the delay adjuster to apply a delay to the audio signal such that a peak value of the audio signal is shifted in time.

18. The audio-haptic signal generator of claim 13 wherein when a sum of an instantaneous signal values of the audio and of the haptic signals exceeds an amplifier voltage clipping level, the gain controller may control the gain adjuster to apply an attenuation corresponding to a gain value lower than 0 dB.

19. A haptic system comprising the audio-haptic signal generator of claim 1 and an amplifier having an input coupled to the output of the mixer and an output configured to be coupled to a haptic actuator.

20. A human machine interface comprising the haptic system of claim 19.

* * * * *